United States Patent
Lee et al.

(10) Patent No.: US 11,764,253 B2
(45) Date of Patent: Sep. 19, 2023

(54) LIGHT-EMITTING DIODE UNIT FOR DISPLAY COMPRISING PLURALITY OF PIXELS AND DISPLAY DEVICE HAVING SAME

(71) Applicant: SEOUL VIOSYS CO., LTD., Ansan-si (KR)

(72) Inventors: Chung Hoon Lee, Ansan-si (KR); Jong Hyeon Chae, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 67 days.

(21) Appl. No.: 17/403,793

(22) Filed: Aug. 16, 2021

(65) Prior Publication Data
US 2022/0037395 A1 Feb. 3, 2022

Related U.S. Application Data

(63) Continuation of application No. 16/762,357, filed as application No. PCT/KR2017/012558 on Nov. 8, 2017, now Pat. No. 11,121,172.

(51) Int. Cl.
*H01L 27/15* (2006.01)
*H01L 25/065* (2023.01)
*H01L 25/18* (2023.01)

(52) U.S. Cl.
CPC ........ *H01L 27/156* (2013.01); *H01L 25/0655* (2013.01); *H01L 25/18* (2013.01)

(58) Field of Classification Search
CPC ... H01L 27/156; H01L 25/0655; H01L 25/18; H01L 33/20; H01L 33/382; H01L 33/44; H01L 33/505; H01L 33/507; H01L 33/62; H01L 33/504; H01L 33/36; H01L 33/50
See application file for complete search history.

(56) References Cited

U.S. PATENT DOCUMENTS 8,592,232 B2 11/2013 Suh et al.
8,829,540 B2 9/2014 Kim et al.
10,361,249 B2 7/2019 Pfeuffer et al.
(Continued)

FOREIGN PATENT DOCUMENTS

EP 3 690 944 8/2020
JP 2002-118293 4/2002
(Continued)

OTHER PUBLICATIONS

International Search Report dated Aug. 6, 2018, in International Application No. PCT/KR2017/012558 with English Translation.
(Continued)

*Primary Examiner* — Elias Ullah
(74) *Attorney, Agent, or Firm* — H.C. Park & Associates, PLC

(57) ABSTRACT

A light-emitting diode (LED) unit for a display including a plurality of pixels each including a first light emitting cell, a second light emitting cell, and a third light emitting cell, each of the first, second, and third light emitting cells including a first conductivity type semiconductor layer, an active layer, and a second conductivity type semiconductor layer, a first wavelength converter configured to convert a wavelength of light emitted from the first light emitting cell, a second wavelength converter configured to convert a wavelength of light emitted from the second light emitting cell, in which the first, second, and third light emitting cells of each pixel share the first conductivity type semiconductor layer.

20 Claims, 12 Drawing Sheets

(56) References Cited

U.S. PATENT DOCUMENTS

| | | |
|---|---|---|
| 10,950,583 B2 | 3/2021 | Moon et al. |
| 2014/0367633 A1 | 12/2014 | Bibl et al. |
| 2015/0228865 A1 | 8/2015 | Rhee |
| 2017/0032735 A1 | 2/2017 | Lee et al. |
| 2017/0236866 A1 | 8/2017 | Lee et al. |
| 2017/0256687 A1 | 9/2017 | Yoo et al. |
| 2017/0294479 A1 | 10/2017 | Cha et al. |
| 2020/0279979 A1 | 9/2020 | Lee et al. |

FOREIGN PATENT DOCUMENTS

| | | |
|---|---|---|
| JP | 2002-217454 | 8/2002 |
| JP | 2002217545 | 8/2002 |
| JP | 2011-171739 | 9/2011 |
| JP | 2014-507804 | 3/2014 |
| JP | 2016-154213 | 8/2016 |
| JP | 2016-218151 | 12/2016 |
| KR | 10-2011-0098600 | 9/2011 |
| KR | 10-2013-0137985 | 12/2013 |
| KR | 10-2014-0083488 | 7/2014 |
| KR | 10-2017-0099324 | 8/2017 |
| KR | 10-2017-0108623 | 9/2017 |
| KR | 10-2017-0116296 | 10/2017 |
| WO | 2016192939 | 12/2016 |
| WO | 2017034379 | 3/2017 |
| WO | 2019066491 | 4/2019 |

OTHER PUBLICATIONS

Extended European Search Report dated May 27, 2021, issued in European Patent Application No. 17931562.7.
Office Action dated Jul. 13, 2021 for Japanese Patent Application No. 2020-524640.
Notice of Allowance dated May 13, 2021, in U.S. Appl. No. 16/762,357.
Substantive Examination Report dated Jun. 15, 2022, for Saudi Arabian Patent Application No. 520411914.
Japanese Office Action dated May 10, 2022, for Japanese Patent Application No. 2020-524640 (with English Translation).

LIGHT-EMITTING DIODE UNIT FOR DISPLAY COMPRISING PLURALITY OF PIXELS AND DISPLAY DEVICE HAVING SAME

CROSS-REFERENCE TO RELATED APPLICATIONS

This application is a Continuation of U.S patent application Ser. No. 16/762,357, filed on May 7, 2020, which is National Stage Entry of International Application No. PCT/KR2017/012558, filed on Nov. 8, 2017, each of which is hereby incorporated by reference for all purposes as if fully set forth herein.

BACKGROUND

Field

Exemplary embodiments relate to a light emitting diode for a next-generation display and a display apparatus having the same.

Discussion of the Background

As an inorganic light source, light emitting diodes have been used in various technical fields, such as displays, vehicular lamps, general lighting, and the like. With various advantages of the light emitting diodes, such as longer lifespan, lower power consumption, and faster response, than existing light sources, light emitting diodes have been replacing the existing light sources.

Conventional light emitting diodes have been generally used as backlight light sources in display apparatuses. However, a micro LED has been developed recently as a next-generation display that directly realizes an image using light emitting diodes.

In general, a display apparatus displays various colors through mixture of blue, green, and red light. Each pixel of the display apparatus includes blue, green, and red sub-pixels, in which a color of a certain pixel is determined based on the colors of the sub-pixels, and an image is realized through a combination of such pixels.

In the case of the micro LED display, micro LEDs are disposed at respective sub-pixels, and accordingly, a large number of micro LEDs need to be arranged on a single substrate. However, a micro LED is extremely small, which is 200 μm or less, and further 100 μm or less, and these small sizes cause various problems. In particular, it is difficult to handle the light emitting diode having a small size, and it is also difficult to replace a defective LED from mounted micro LEDs with a good-quality LED.

The light emitting diode generally emits ultraviolet or blue light, and can be combined with a phosphor to realize green light and red light. In addition, a color filter is used for each sub-pixel to improve the purity of each color, and each of the color filters has a difference in filter efficiency. Accordingly, even if the same light emitting diode is operated to emit light having the same intensity, differences in the light intensity of the blue sub-pixel, the green sub-pixel, and the red sub-pixel may occur. To overcome the differences, an operating current density of each light emitting diode may be changed, but such may decrease light emitting efficiency of the light emitting diode due to the change in current density.

The above information disclosed in this Background section is only for understanding of the background of the inventive concepts, and, therefore, it may contain information that does not constitute prior art.

SUMMARY

Exemplary embodiments provide a light emitting diode for a display that can be easily mounted and replaced and a display apparatus having the same.

Exemplary embodiments also provide a light emitting diode for a display that is capable of operating light emitting diodes of each sub-pixel under an optimum light emission efficiency condition and a display apparatus having the same.

Additional features of the inventive concepts will be set forth in the description which follows, and in part will be apparent from the description, or may be learned by practice of the inventive concepts.

An LED unit for a display according to an exemplary embodiment includes a plurality of pixels. Each of the pixels includes: a first light emitting cell, a second light emitting cell, and a third light emitting cell, each of the first, second, and third light emitting cells including a first conductivity type semiconductor layer, an active layer, and a second conductivity type semiconductor layer; pads electrically connected to the first, second, and third light emitting cells to independently drive the first, second, and third light emitting cells; a first wavelength converter that converts a wavelength of light emitted from the first light emitting cell; and a second wavelength converter that converts a wavelength of light emitted from the second light emitting cell, in which the first wavelength converter converts a wavelength of light to a longer wavelength than a wavelength of light converted by the second wavelength converter, the second light emitting cell has a larger area than that of the third light emitting cell, and the first light emitting cell has a larger area than that of the second light emitting cell.

A display apparatus according to another exemplary embodiment includes: a circuit board; and a plurality of LED units arranged on the circuit board, in which each of the plurality of LED units includes the LED unit for a display according to the exemplary embodiment above.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
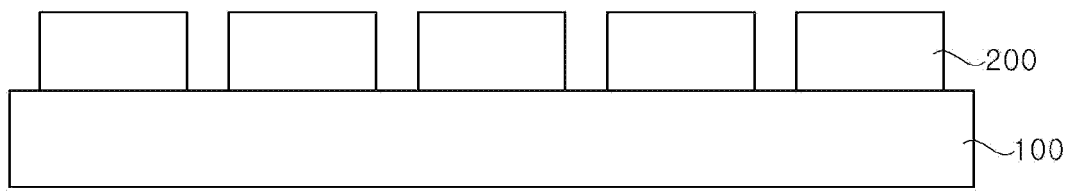
FIG. 1 is a schematic cross-sectional view illustrating a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

An LED unit for a display according to an exemplary embodiment includes a plurality of pixels. Each of the pixels includes: a first light emitting cell, a second light emitting cell, and a third light emitting cell, each of the first, second, and third light emitting cells including a first conductivity type semiconductor layer, an active layer, and a second conductivity type semiconductor layer; pads electrically connected to the first, second, and third light emitting cells to independently drive the first, second, and third light emitting cells; a second wavelength converter that converts a wavelength of light emitted from the second light emitting cell; and a third wavelength converter that converts a wavelength of light emitted from the third light emitting cell, in which the third wavelength converter converts a wavelength of light to a longer wavelength than a wavelength of light converted by the second wavelength converter, the second light emitting cell has a larger area than that of the first light emitting cell, and the third light emitting cell has a larger area than that of the second light emitting cell.

A plurality of pixels is disposed in one LED unit and three light emitting cells are disposed in each of the pixels to realize light of different colors in each pixel. As such, a plurality of pixels that includes three sub-pixels may be formed using one LED unit. Accordingly, a size of the LED unit is relatively increased compared to that of the conventional micro LED, and thus, it may be easy to mount and replace the LED unit. Further, areas of the light emitting cells are set to be different from one another by considering a conversion efficiency of a wavelength converter and the like, and thus, the light emitting cells may be driven under an optimum light emission efficiency condition.

As used herein, the term "LED unit" refers to a unit of a light emitting diode mounted on a circuit board. Pixels in one LED unit are physically connected to one another so that the pixels in the LED unit are mounted or replaced together. As such, the pixels in one LED unit may not be separately used. Accordingly, one LED unit includes an element that connects internal pixels to one another, and the element is spaced apart from another LED unit.

The first, second, and third light emitting cells may emit blue light, the second wavelength converter may convert the blue light into green light, and the third wavelength converter may convert the blue light into red light. Blue light emitted from the first light emitting cell is used without wavelength conversion.

Area ratios of the second light emitting cell and the third light emitting cell to the first light emitting cell may be set in consideration of a light conversion efficiency of the second wavelength converter and a light conversion efficiency of the third wavelength converter, respectively. In particular, as the light conversion efficiency of the wavelength converter becomes larger, the area of the light emitting cell becomes larger. For example, the area ratios of the second light emitting cell and the third light emitting cell to the first light emitting cell may be inversely proportional to the light conversion efficiency of the second wavelength converter and the light conversion efficiency of the third wavelength converter, respectively.

The LED unit for a display may further include a first wavelength converter that converts a wavelength of light emitted from the first light emitting cell to light of a first wavelength, in which the first wavelength converter may convert a wavelength of light to a shorter wavelength than a wavelength of light converted by the second wavelength converter, and the first, second, and third light emitting cells may emit ultraviolet light.

The first wavelength converter may convert ultraviolet light into blue light, the second wavelength converter may convert the ultraviolet light into green light, and the third wavelength converter may convert the ultraviolet light into red light.

Area ratios of the second light emitting cell and the third light emitting cell to the first light emitting cell may be set in consideration of light conversion efficiencies of the first wavelength converter, the second wavelength converter, and the third wavelength converter. For example, the area ratios of the second light emitting cell and the third light emitting cell to the first light emitting cell may be inversely proportional to a light conversion efficiency ratio of the second wavelength converter to the first wavelength converter and a light conversion efficiency ratio of the third wavelength converter to the first wavelength converter, respectively.

The LED unit for a display may further include a second color filter disposed on the second wavelength converter; and a third color filter disposed on the third wavelength converter. The second color filter may filter light other than green light, and the third color filter may filter light other than red light. The light emitting diode for a display may further include a first color filter disposed on the first wavelength converter, and the first color filter filters light other than blue light.

Area ratios of the first light emitting cell, the second light emitting cell, and the third light emitting cell may be 1:2:7.

The first, second, and third light emitting cells of each pixel may share a first conductivity type semiconductor layer. Further, at least two pixels may share the first conductivity type semiconductor layer. The light emitting cells or pixels may share the first conductivity type semiconductor layer, thereby providing an LED unit having a simple manufacturing process and structure.

At least one pad may be commonly electrically connected to the first conductivity type semiconductor layer or the second conductivity type semiconductor layer of the first, second, and third light emitting cells. As such, the number of pads that are required may be reduced.

The LED unit for a display may further include: ohmic reflection layers disposed on the second conductivity type semiconductor layers of the first, second, and third light emitting cells; a lower insulation layer covering the first, second, and third light emitting cells of the plurality of pixels and including at least one first opening exposing a first conductivity type semiconductor layer and second openings exposing the ohmic reflection layers. In addition, the LED unit for a display may further include: a first pad electrode disposed on the lower insulation layer and electrically connected to the first conductivity type semiconductor layer through the first opening of the lower insulation layer; a second pad electrode spaced apart from the first pad electrode to be disposed on the lower insulation layer and electrically connected to the ohmic reflection layer through the second opening; and an upper insulation layer covering the first and second pad electrodes, in which the pads may be connected to the first and second pad electrodes through openings of the upper insulation layer.

The lower insulation layer may include a distributed Bragg reflector. The lower insulation layer may cover side surfaces of the light emitting cells, and thus, light interference between the light emitting cells may be prevented.

The pads may include one first pad that are commonly connected to the first conductivity type semiconductor layers of the first, second, and third light emitting cells and three second pads that are connected to the second conductivity type semiconductor layers of the first, second, and third light emitting cells, respectively. The one first pad may be commonly connected to first conductivity type semiconductor layers of at least two pixels.

In another exemplary embodiment, the pads may include first pads connected to the first conductivity type semiconductor layers of the first, second, and third light emitting cells, respectively, and one second pad commonly connected to the second conductivity type semiconductor layers of the first, second, and third light emitting cells. The one second pad may be commonly connected to second conductivity type semiconductor layers of at least two pixels.

A display apparatus according to another exemplary embodiment includes: a circuit board; and a plurality of LED units arranged on the circuit board, in which each of the plurality of LED units is the LED unit for a display according to the exemplary embodiment above.

The first, second, and third light emitting cells may further be driven in a passive matrix or active matrix manner.

Hereinafter, exemplary embodiments of the present disclosure will be described in detail with reference to the accompanying drawings.

Figure 2:
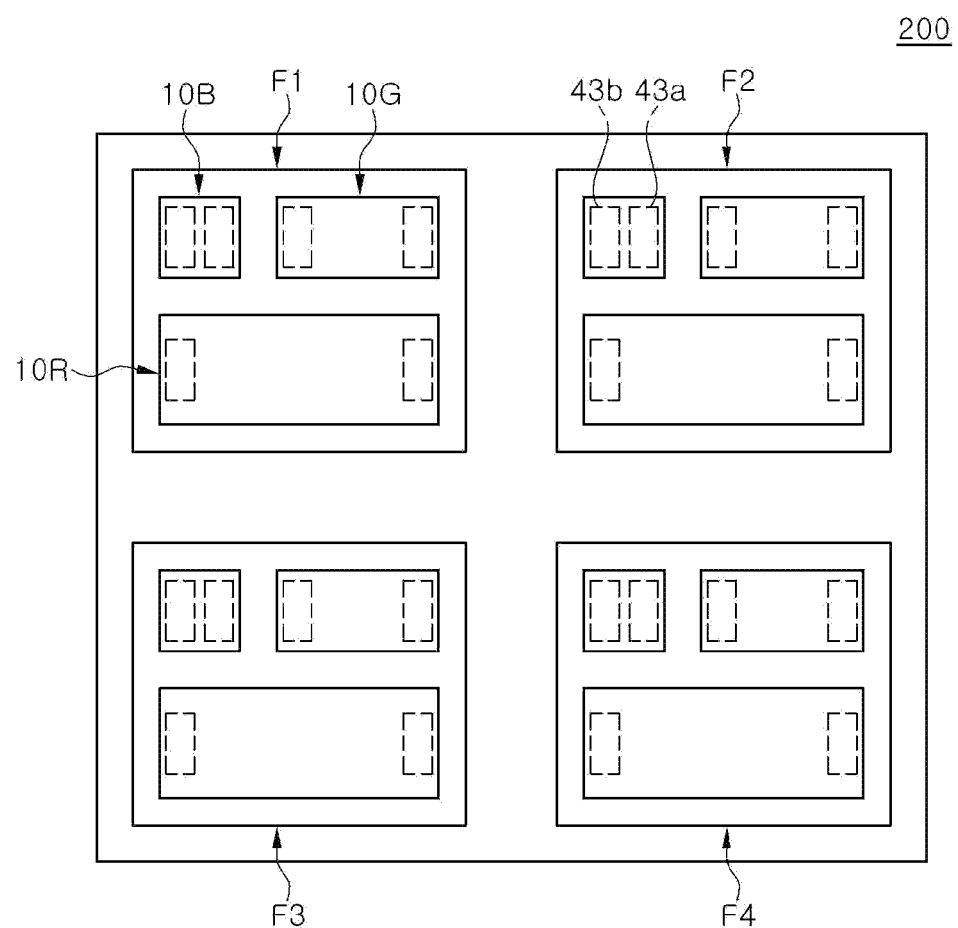
FIG. 2 is a schematic plan view illustrating an LED unit for a display according to an exemplary embodiment.
Figure 3:
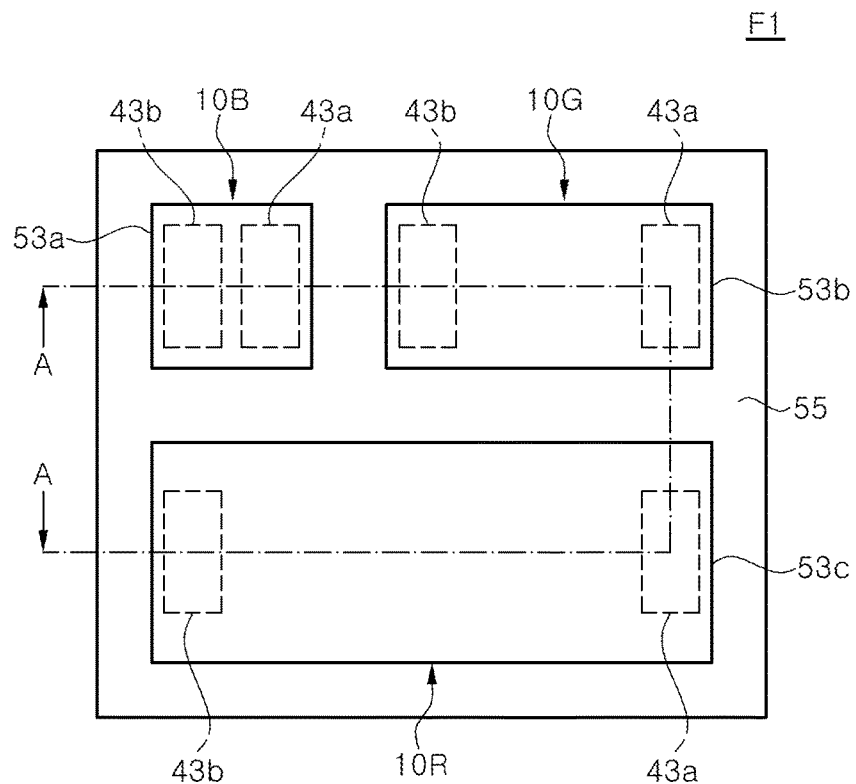
FIG. 3 is an enlarged plan view of a pixel in the LED unit for a display of FIG. 2.
Figure 4:
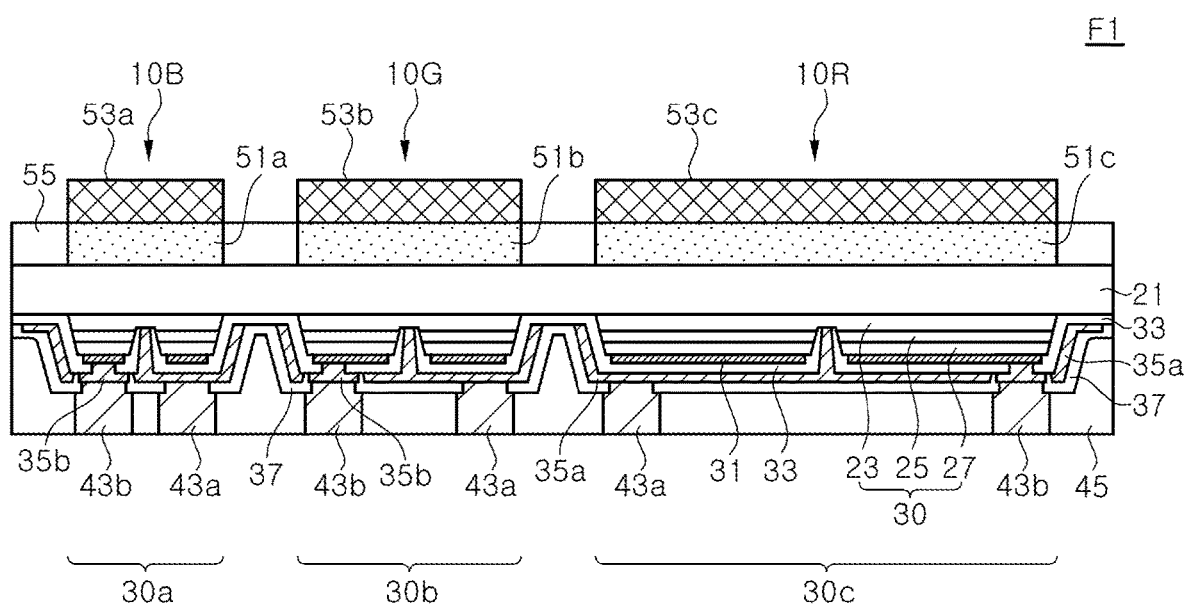
FIG. 4 is a schematic cross-sectional view taken along line A-A of FIG. 3.

FIG. 1 is a schematic cross-sectional view illustrating a display apparatus according to an exemplary embodiment, FIG. 2 is a schematic plan view illustrating an LED unit for a display according to an exemplary embodiment, FIG. 3 is an enlarged plan view of a pixel in the LED unit for a display of FIG. 2, and FIG. 4 is a schematic cross-sectional view taken along line A-A of FIG. 3.

Referring to FIG. 1, the display apparatus includes a circuit board 100 and an LED unit 200 for a display. Although the display apparatus according to the illustrated exemplary embodiment shows a plurality of LED units 200 disposed on the circuit board 100, the inventive concepts are not necessarily limited thereto, and a single LED unit 200 may be disposed on the circuit board 100.

The circuit board 100 includes a circuit for driving light emitting cells in the LED unit 200 in a passive matrix or active matrix manner. For example, to drive the LED unit in a passive matrix manner, the circuit board 100 may be configured as a printed circuit board including passive devices, such as resistors. Alternatively, to drive in an active matrix manner, the circuit board 100 may include active devices, such as thin film transistors.

The LED unit 200 for a display includes a plurality of pixels F1, F2, F3, and F4 as shown in FIG. 2. In the illustrated exemplary embodiment, four pixels are shown, but the inventive concepts are not limited thereto, and the number of pixels disposed in one LED unit 200 may be two or three, or may be five or more. Each of the pixel F1, F2, F3 or F4 includes three light emitting cells, and wavelength converters are disposed on each of the light emitting cells to realize blue, green, and red light. Structures of the pixels F1, F2, F3, and F4 are generally the same or similar to each other. Hereinafter, the structure of the pixels F1, F2, F3, and F4 will be described in detail with reference to the pixel F1 in FIG. 3 and FIG. 4.

Referring to FIG. 3 and FIG. 4, the pixel F1 may include a substrate 21, first, second, and third light emitting cells 30 (30a, 30b, 30c), an ohmic reflection layer 31, a lower insulation layer 33, first and second pad electrodes 35a and 35b, an upper insulation layer 37, a first wavelength converter 51a, a second wavelength converter 51b, a third wavelength converter 51c, a first color filter 53a, a second color filter 53b, a third color filter 53c, and a light blocking material layer 55 (or a partition wall). Each of the first, second, and third light emitting cells 30a, 30b, and 30c includes a first conductivity type semiconductor layer 23, an active layer 25, and a second conductivity type semiconductor layer 27. The pixel F1 also includes sub-pixels 10B, 10G, and 10R, where each of the sub-pixels 10B, 10G, and 10R includes the light emitting cell 30, the wavelength converters 51a, 51b, and 51c, and the color filters 53a, 53b, and 53c.

The substrate 21 is not particularly limited as long as it is a substrate capable of growing a gallium nitride-based semiconductor layer thereon, such as a sapphire substrate, a gallium nitride substrate, and a SiC substrate. The substrate 21 may be a patterned sapphire substrate. A plurality of pixels F1, F2, F3, and F4 may be provided on one substrate 21, and the substrate 21 may have a rectangular or square shape, but the inventive concepts are not necessarily limited thereto. An overall size of the substrate 21 may vary depending on the number of pixels formed thereon.

The first, second, and third light emitting cells 30a, 30b, and 30c are disposed to be spaced apart from one another. An interval between the light emitting cells in the pixel F1 may be smaller than that between the pixels F1, F2, F3, and F4, but in some exemplary embodiments, they may be the same.

As shown in FIG. 3 and FIG. 4, the first, second, and third light emitting cells 30a, 30b, and 30c have different areas from one another. The second light emitting cell 30b has a greater area than that of the first light emitting cell 30a, and the third light emitting cell 30c has a greater area than that of the second light emitting cell 30b. Areas of the first, second, and third light emitting cells 30a, 30b, and 30c may be determined in consideration of light conversion efficiencies of the wavelength converters 51a, 51b, and 51c, which will be described later.

The first, second, and third light emitting cells 30a, 30b, and 30c may be disposed adjacent to one another. More particularly, the first light emitting cell 30a may be adjacent to the second and third light emitting cells 30b and 30c, the second light emitting cell 30b may be adjacent to the first and third light emitting cells 30a and 30c, and the third light emitting cell 30c may be adjacent to the first light emitting cell and the second light emitting cell 30a and 30b. As shown in FIG. 3, the first and second light emitting cells 30a and 30b may be arranged along the long axis of the third light emitting cell 30c. However, the inventive concepts are not limited thereto, and the light emitting cells may be variously arranged in other forms. For example, one light emitting cell may be disposed between two remaining light emitting cells. The first, second, and third light emitting cells 30a, 30b, and 30c may have substantially a rectangular shape, but the inventive concepts are not limited thereto, and may have various shapes.

Each of the first, second, and third light emitting cells 30a, 30b, and 30c includes the first conductivity type semiconductor layer 23, the active layer 25, and the second conductivity type semiconductor layer 27. The first conductivity type semiconductor layer 23 is disposed under the substrate 21. The first conductivity type semiconductor layer 23 is a layer grown on the substrate 21, and may be a gallium nitride-based semiconductor layer doped with impurities, such as Si.

The active layer 25 and the second conductivity type semiconductor layer 27 are disposed on the first conductivity type semiconductor layer 23. The active layer 25 is disposed between the first conductivity type semiconductor layer 23 and the second conductivity type semiconductor layer 27. The active layer 25 and the second conductivity type semiconductor layer 27 may have an area smaller than that of the first conductivity type semiconductor layer 23. The active layer 25 and the second conductivity type semiconductor layer 27 may be partially removed to expose a portion of the first conductivity type semiconductor layer 23. As shown in FIG. 4, a through hole may be formed through the active layer 25 and the second conductivity type semiconductor layer 27 to expose the first conductivity type semiconductor layer 23. Alternatively, the active layer 25 and the second conductivity type semiconductor layer 27 may be formed in a mesa shape, and the first conductivity type semiconductor layer 23 around the mesa may be exposed.

The active layer 25 may have a single quantum well structure or multiple quantum well structure. A composition and thickness of the well layer in the active layer 25 determines a wavelength of light that is generated. In particular, the active layer 25 may generate ultraviolet or blue light by adjusting the composition of the well layer. In an exemplary embodiment, each of the active layers 25 of the first light emitting cell 30a, the second light emitting cell 30b, and the third light emitting cell 30c is grown on the same substrate 21 under the same conditions, and have substantially the same composition and thickness, thereby emitting light of the same wavelength.

The second conductivity type semiconductor layer 27 may be a gallium nitride-based semiconductor layer doped with a p-type impurity, for example Mg. Each of the first conductivity type semiconductor layer 23 and the second conductivity type semiconductor layer 27 may be a single layer, but the inventive concepts are not limited thereto, and may be a multiple layer or may include a superlattice layer. The first conductivity type semiconductor layer 23, the active layer 25, and the second conductivity type semiconductor layer 27 may be grown on the substrate 21 in a chamber using a known method, such as metal organic chemical vapor deposition (MOCVD) or molecular beam epitaxy (MBE).

The ohmic reflection layer 31 is in ohmic contact with the second conductivity type semiconductor layer 27 of each of the light emitting cell 30a, 30b, and 30c. The ohmic reflection layer 31 may include an ohmic layer such as Ni or ITO, and a reflection layer such as Ag or Al. The ohmic reflection layer 31 may also include a transparent oxide layer such as ITO, and an insulation layer such as $SiO_2$ between the reflection layers. The reflection layer may connect to the transparent oxide layer through an insulation layer.

The lower insulation layer 33 covers the light emitting cells 30a, 30b, and 30c, and covers side surfaces of the exposed second conductivity type semiconductor layer 27 and the active layer 25. The lower insulation layer 33 has openings exposing the first conductivity type semiconductor layer 23 and the ohmic reflection layer 31. The lower insulation layer 33 may include a single layer, such as $SiO_2$ or $Si_3N_4$, but the inventive concepts are not limited thereto, and may include multiple layers. In particular, the lower insulation layer 33 may include a distributed Bragg reflector.

The first pad electrode 35a and the second pad electrode 35b are disposed on the lower insulation layer 33. The first pad electrode 35a and the second pad electrode 35b are disposed on each light emitting cell, the first pad electrode 35a is electrically connected to the first conductivity type semiconductor layer 23, and the second pad electrode 35b is electrically connected to the ohmic reflection layer 31. The first pad electrode 35a and the second pad electrode 35b may be formed together in the same process, and thus, may be located at substantially the same level. In some exemplary embodiments, the second pad electrode 35b may be omitted.

In the illustrated exemplary embodiment, the first pad electrode 35a may be disposed to surround the second pad electrode 35b. Also, the pad electrodes 35a and 35b of one sub-pixel may be spaced apart from the pad electrodes 35a and 35b of an adjacent sub-pixel. As such, the first, second, and third light emitting cells 30a, 30b, and 30c in the LED unit 200 are electrically spaced apart from one another. Furthermore, the pad electrodes 35a and 35b in the pixel F1 are also spaced apart from the pad electrodes 35a and 35b in the other pixels F2, F3, and F4. However, the inventive concepts are not limited thereto, and in some exemplary embodiments, the light emitting cells 30a, 30b, and 30c are electrically connected to one another, and/or the light emitting cells are electrically connected between pixels. This will be described in detail later.

The upper insulation layer 37 covers the first and second pad electrodes 35a and 35b, and has openings exposing the first and second pad electrodes 35a and 35b. The upper insulation layer 37 may include a single layer, such as $SiO_2$ or $Si_3N_4$, but the inventive concepts are not limited thereto, and may include multiple layers. In particular, the lower insulation layer 33 may include a distributed Bragg reflector.

The first and second bump pads 43a and 43b are formed on each of the light emitting cell 30a, 30b, and 30c, and connected to the first and second pad electrodes 35a and 35b through the openings of the upper insulation layer 37, respectively. More particularly, the first bump pad 43a is connected to the first pad electrode 35a, and the second bump pad 43b is connected to the second pad electrode 35b. Two bump pads 43a and 43b are provided for each of the light emitting cell 30a, 30b, and 30c.

The bump pads 43a and 43b occupy a relatively large area, and maximum widths of the bump pads 43a and 43b may exceed at least about ½ of a minimum width of the light emitting cell. The bump pads 43a and 43b may have a rectangular shape as illustrated, but are not limited thereto, and may have a circular or elliptical shape. The bump pads 43a and 43b may be used to mount the LED unit 200 on the circuit board 100, and may include Au or AuSn, for example.

A dummy bump pad in addition to the bump pads 43a and 43b, may be disposed on at least one light emitting cell. Since the light emitting cells have different areas, the dummy bump pad may be disposed on the light emitting cells 30b or 30c that has a relatively large area. The dummy bump pad may be disposed on the upper insulation layer 37 to be electrically isolated from the bump pads 43a and 43b. The dummy bump pad may be used as a heat dissipation path for dissipating heat generated from light emitting cells, thereby improving light efficiency of the LED unit 200.

A support member 45 may cover side surfaces of the bump pads 43a and 43b. The support member 45 may also cover side surfaces of the dummy bump pad. The support member 45 may include a thermosetting or thermoplastic resin.

The first, second, and third wavelength converters 51a, 51b, and 51c are disposed on the substrate 21 to face the light emitting cells 30a, 30b, and 30c with the substrate 21 therebetween. The first wavelength converter 51a is disposed on the first light emitting cell 30a, the second wavelength converter 51b is disposed on the second light emitting cell 30b, and the third wavelength converter 51c is disposed the third light emitting cell 30c.

The first wavelength converter 51a converts a wavelength of light emitted from the first light emitting cell 30a, and the second wavelength converter 51b converts a wavelength of light emitted from the second light emitting cell 30b, and the third wavelength converter 51c converts a wavelength of light emitted from the third light emitting cell 30c. More particularly, the second wavelength converter 51b converts light to have a longer wavelength than a wavelength of light converted by the first wavelength converter 51a, and the third wavelength converter 51c converts light to have a longer wavelength than a wavelength of light converted by the second wavelength converter 51b. For example, the first, second, and third light emitting cells 30a, 30b, and 30c may emit ultraviolet light, the first wavelength converter 51a converts ultraviolet light into blue light, and the second wavelength converter 51b converts ultraviolet light into green light, and the third wavelength converter 51c may convert ultraviolet light into red light.

The first color filter 53a, the second color filter 53b, and the third color filter 53c are disposed on the first, second, and third wavelength converters 51a, 51b, and 51c, respectively, and filter light emitted therefrom. For example, the first color filter 53a filters light other than blue light, the second color filter 53b filters light other than green light, and the third color filter 53c filters light other than red light. By using the first, second, and third color filters 53a, 53b, and 53c, color purity of blue light, green light, and red light may be improved.

Although the active layer 25 is exemplarily described as emitting ultraviolet light, in some exemplary embodiments, the active layer 25 may emit blue light. In this case, the first wavelength converter 51a may be omitted, and a transparent resin may be disposed in place of the first wavelength converter 51a. Meanwhile, the second wavelength converter 51b converts blue light into green light, and the third wavelength converter 51c converts blue light into red light.

The light blocking material layer 55 may be disposed between the wavelength converters 51a, 51b, and 51c. The light blocking material layer 55 blocks light from progressing from one wavelength converter to another wavelength converter, thereby preventing light interference between the sub-pixels 10B, 10G, and 10R. The light blocking material layer 55 may include white resin or PSR that is capable of reflecting light. The lower insulation layer 33 may include the distributed Bragg reflector, or the first pad electrode 35a and/or the second pad electrode 35b may be disposed to cover sidewalls of the light emitting cells, and thus, light interference between the light emitting cells 30a, 30b, and 30c is prevented.

The pixel F1 according to the illustrated exemplary embodiment has three sub-pixels 10B, 10G, and 10R, and the sub-pixels are fixed on the substrate 21. For example, the sub-pixel 10B may realize blue light by the light emitting cell 10a or by a combination of the first light emitting cell 10a and the first wavelength converter 51a, and the sub-pixel 10G may realize green light by a combination of the light emitting cell 10b and the second wavelength converter 51b, and the sub-pixel 10R may realize red light by a combination of the third light emitting cell 10c and the third wavelength converter 51c.

In an exemplary embodiment, the pixels F2, F3, and F4 include sub-pixels having substantially the same structure as those of the pixel F1. Further, the substrate 21, the lower insulation layer 33, and the upper insulation layer 37 may be continuously formed over each of the pixels F1, F2, F3, and F4.

According to an exemplary embodiment, it is possible to provide the LED unit 200 having flip-type light emitting cells, and thus, it is possible to improve light emission efficiency of each light emitting cell.

A plurality of pixels F1, F2, F3, and F4 together with the substrate 21 may be mounted on the circuit board 100. In the case of a conventional micro LED, since the sub-pixels are individually mounted, the number of processes is large and it is difficult to perform the mounting process due to the small size of the individual sub-pixel. However, according to an exemplary embodiment, since one LED unit includes the plurality of pixels F1, F2, F3, and F4, and the size of the LED unit is relatively larger than that of the conventional micro LED, and thus, the number of mounting processes is reduced, and the mounting process is facilitated.

The first, second, and third light emitting cells 30a, 30b, and 30c in the illustrated exemplary embodiment have different areas from one another. Also, the wavelength converters 51a, 51b, and 51c disposed on the light emitting cells have different areas from one another. A relative area of the light emitting cells may be closely related to light conversion efficiencies of the wavelength converters, and may also be related to color filtering efficiencies of the color filters 53a, 53b, and 53c.

The wavelength converters may generally include phosphors. For example, beta sialon (β-SiAlON) may be used for emitting green light, and a CASN (CaAlSiN)-based phosphor may be used for emitting red light.

However, phosphors cannot convert all blue light into green light or red light, and each phosphor has a constant light conversion efficiency. In particular, a red phosphor that converts ultraviolet or blue light of the same wavelength into red light has a smaller light conversion efficiency than that of a green phosphor that converts into green light. Moreover, red light also has lower visibility than green light. As such, when the first, second, and third light emitting cells 30a, 30b, and 30c are formed to have the same area, the third light emitting cell 30c of the sub-pixel 10R that realizes red light has to be driven under a higher current density to implement a sensitivity similar to that of other sub-pixels 10B or 10G. The second light emitting cell 30b of the sub-pixel 10G that realizes green light also has to be driven under a higher current density than that of the third light emitting cell 30a.

More particularly, there is a difference in current density required for realizing an image for each light emitting cell, and accordingly, the first, second, and third light emitting cells 30a, 30b, and 30c that have the same size may not be driven under an optimal light emission efficiency condition.

In the illustrated exemplary embodiment, the light emitting cells are provided with substantially the same or similar current density for driving the light emitting cells by varying the areas of the first, second, and third light emitting cells 30a, 30b, and 30c, and thus, the light emitting cells may be driven under the optimum light emission efficiency condition.

The relative areas of the first, second, and third light emitting cells 30a, 30b, and 30c may be determined in consideration of the relative light conversion efficiency of the first, second, and third wavelength converters 51a, 51b, and 51c. As the light conversion efficiency of the wavelength converter becomes less, the area of the corresponding light emitting cell may be formed to be greater.

For example, when the first, second, and third light emitting cells 30a, 30b, and 30c emit blue light, the first wavelength converter 51a is omitted, and area ratios of the second light emitting cell 30b and the third light emitting cell 30c to the first light emitting cell 30a may be inversely proportional to the light conversion efficiency of the second wavelength converter 51b and the light conversion efficiency of the third wavelength converter 51c, respectively. When the second wavelength converter 51b includes beta sialon (β-SiAlON) and the third wavelength converter 51c includes CASN, relative areas ratios of the first light emitting cell 30a, the second light emitting cell 30b, and the third light emitting cell 30c may be about 1: 2: 7.

When the first, second, and third light emitting cells 30a, 30b, and 30c emit ultraviolet light, the area ratio of the second light emitting cell 30b and the third light emitting cell 30c relative to the first light emitting cell 30a may be inversely proportional to the light conversion efficiency ratio of the second wavelength converter 51b to the first wavelength converter 51a and the light conversion efficiency ratio of the third wavelength converter 51c to the first wavelength converter 51a, respectively.

Although, it is described that the area of the light emitting cells is determined in consideration of the light conversion efficiencies of the wavelength converters in the above exemplary embodiment, when filtering efficiencies of the first, second, and third color filters 53a, 53b, and 53c are different from one another, the areas of the light emitting cells may be determined in consideration of the difference in the filtering efficiencies.

According to the illustrated exemplary embodiment, the areas of the first, second, and third light emitting cells 30a, 30b, and 30c are set to be different from one another, and thus, the light emitting cells may be driven under substantially the same current density. As such, the current density may be set with the optimal condition for driving the light emitting cells, thereby improving light emission efficiency.

Figure 5:
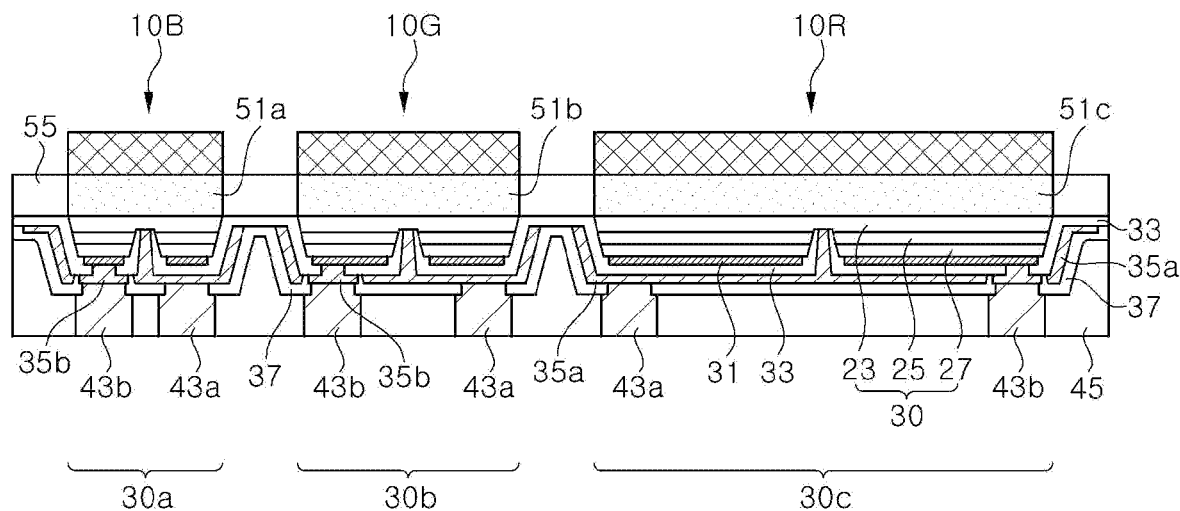
FIG. 5 is a schematic cross-sectional view of a pixel in an LED unit for a display according to another exemplary embodiment.

FIG. 5 is a schematic cross-sectional view of a pixel illustrating an LED unit for a display according to another exemplary embodiment.

Referring to FIG. 5, the LED unit according to the illustrated exemplary embodiment is substantially similar to the LED unit described with reference to FIG. 3 and FIG. 4, except that the substrate 21 is omitted. As such, first, second, and third wavelength converters 51a, 51b, and 51c are disposed on light emitting cells 30a, 30b, and 30c instead of being disposed on the substrate 21. The substrate 21 may be removed using a technique such as laser lift-off or the like, and roughness may be formed on a surface of an exposed first conductivity type semiconductor layer 23.

According to the illustrated exemplary embodiment, since the substrate 21 is removed, light interference that may be generated between adjacent sub-pixels and between adjacent pixels F1, F2, F3, and F4 caused by light transmitted in the lateral direction through the substrate 21 may be further suppressed.

Figure 6:
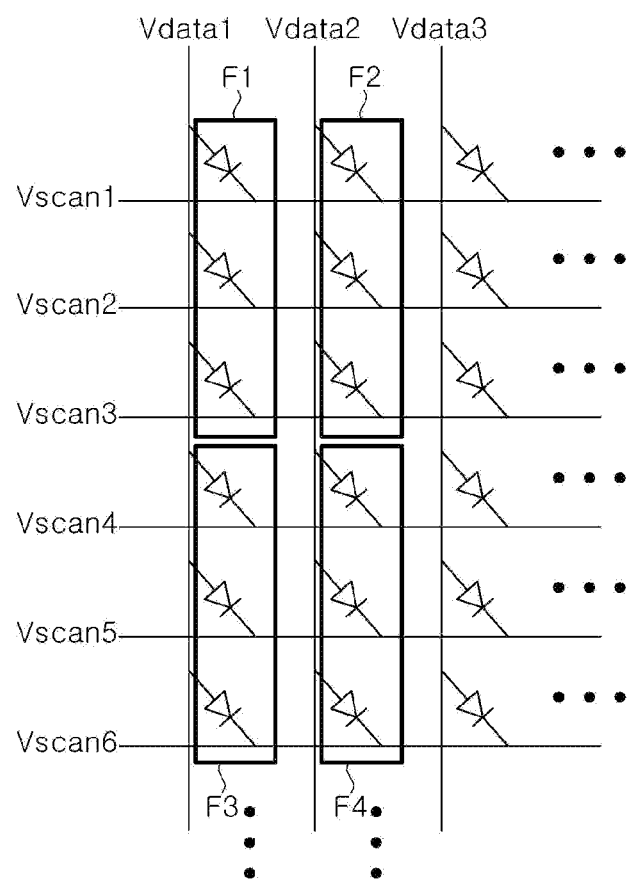
FIG. 6 is a schematic circuit diagram illustrating a driving manner of a display apparatus according to an exemplary embodiment.

FIG. 6 is a schematic circuit diagram illustrating a driving manner of a display apparatus according to an exemplary embodiment. Hereinafter, a region indicated by the bold line represents a pixel that has three light emitting cells.

Referring to FIG. 6, a plurality of LED units may be arranged on the circuit board 100 of FIG. 1, and accordingly, light emitting cells may be arranged in a matrix form. Pixels F1, F2, F3, and F4 in one LED unit 200 may be connected to a scan line and a data line as shown in FIG. 6. The scan line and the data line may be provided in the circuit board 100, and pad electrodes 35a and 35b may be bonded on the circuit board 100 to form a circuit as shown in FIG. 6. More particularly, anodes of three light emitting cells in the pixel F1 and three light emitting cells in the pixel F3 are commonly connected to a data line Vdata1, and cathodes thereof are connected to scan lines Vscan1, Vscan2, Vscan3, Vscan4, Vscan5, and Vscan6 that are different from one another. Anodes of three light emitting cells in the pixel F2 and three light emitting cells in the pixel F4 are commonly connected to a data line Vdata2, and cathodes thereof are connected to the scan lines Vscan1, Vscan2, Vscan3, Vscan4, Vscan5, and Vscan6 that are different from one another. As shown in the drawing, the cathode of each light emitting cell of the pixel F1 is connected to the same scanning line together with the cathode of each light emitting cell of the pixel F2.

A sub-pixel that emits light may be selected by the scan line and the data line, and images may be realized by sequentially selecting sub-pixels. Also, light intensity emitted from one sub-pixel may be adjusted by using a pulse width modulation (PWM) method or by changing a voltage (or current) between the data line and the scan line.

Figure 7:
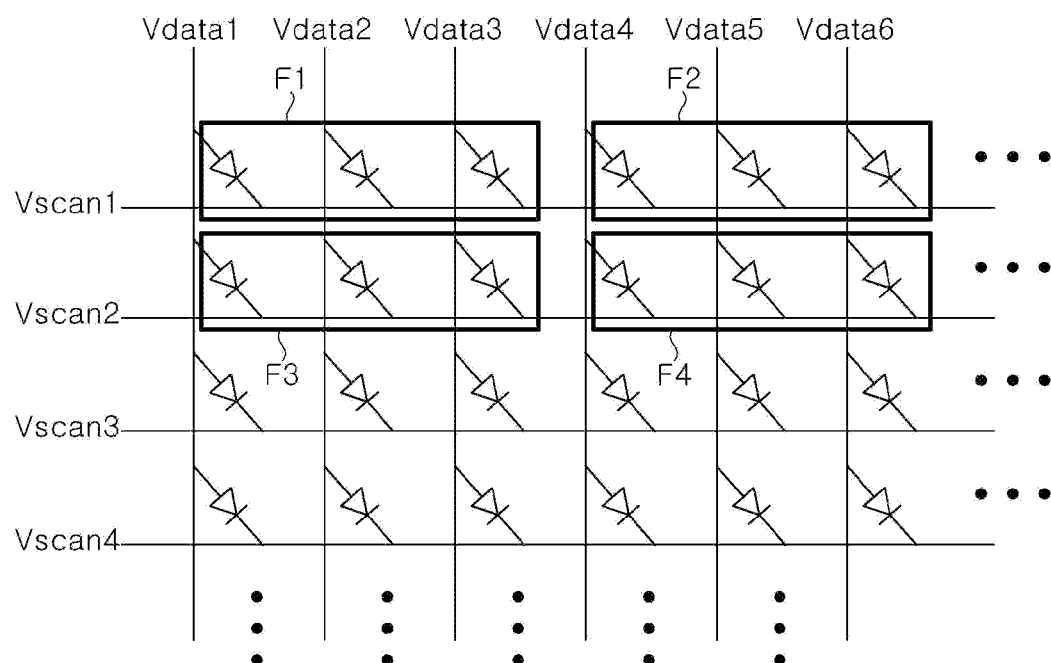
FIG. 7 is a schematic circuit diagram illustrating a driving manner of a display apparatus according to another exemplary embodiment.

FIG. 7 is a schematic circuit diagram illustrating a driving manner of a display apparatus according to another exemplary embodiment.

Referring back to FIG. 6, the anodes of the light emitting cells in one pixel are connected to the same data line and the cathodes are connected to different scan lines, however, according to the illustrated exemplary embodiment shown in FIG. 7, anodes of the light emitting cells are connected to different data lines, and cathodes are connected to the same scan line. Further, pixels F1, F2, F3, and F4 in an LED unit are arranged in a matrix form in a driving circuit.

Figure 8:
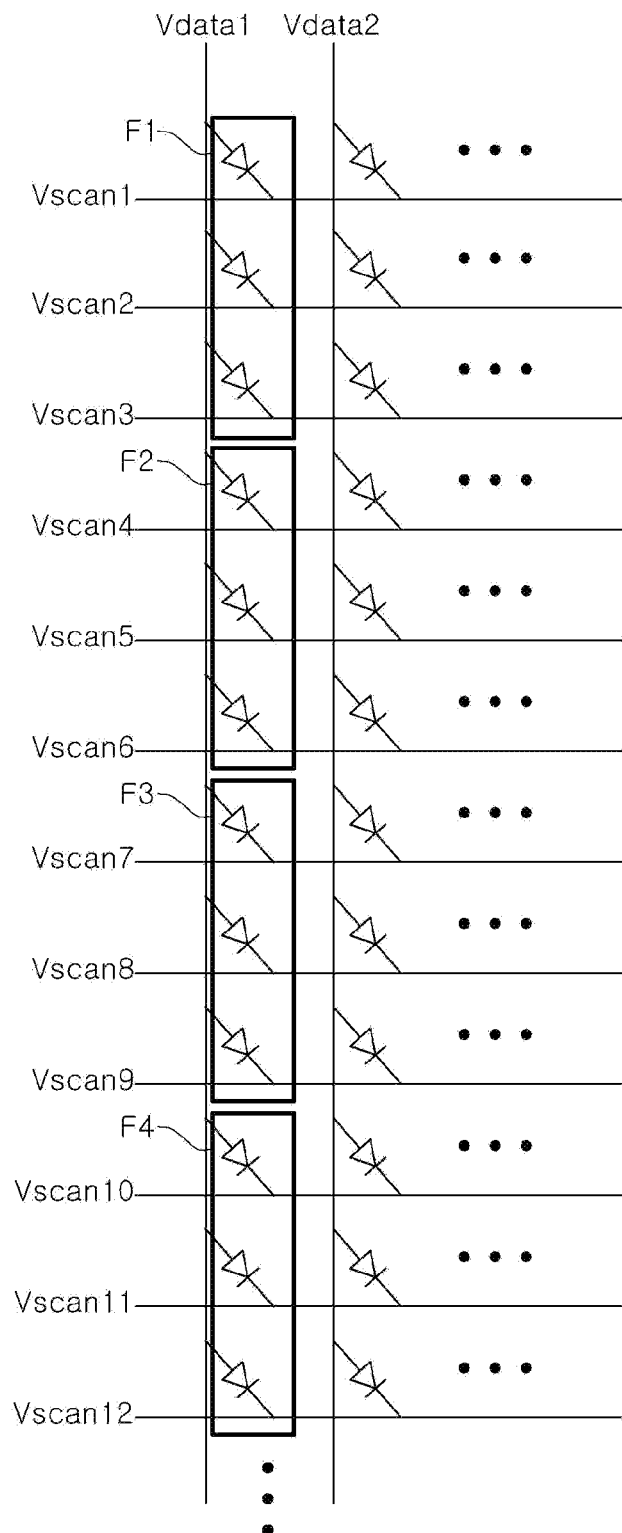
FIG. 8 is a schematic circuit diagram illustrating a driving manner of a display apparatus according to another exemplary embodiment.

FIG. 8 is a schematic circuit diagram illustrating a driving manner of a display apparatus according to another exemplary embodiment.

In FIGS. 6 and 7, the pixels F1, F2, F3, and F4 are arranged in a matrix form in the driving circuit, however, according to the illustrated exemplary embodiment shown in FIG. 8, anodes of all light emitting cells are connected to the same data line. Pixels F1, F2, F3, and F4 may be arranged in a matrix form on the substrate 21, but a circuit as shown in FIG. 8 may also be formed through electrical connection between the pixels F1, F2, F3, and F4 and a circuit board 100.

Figure 9:
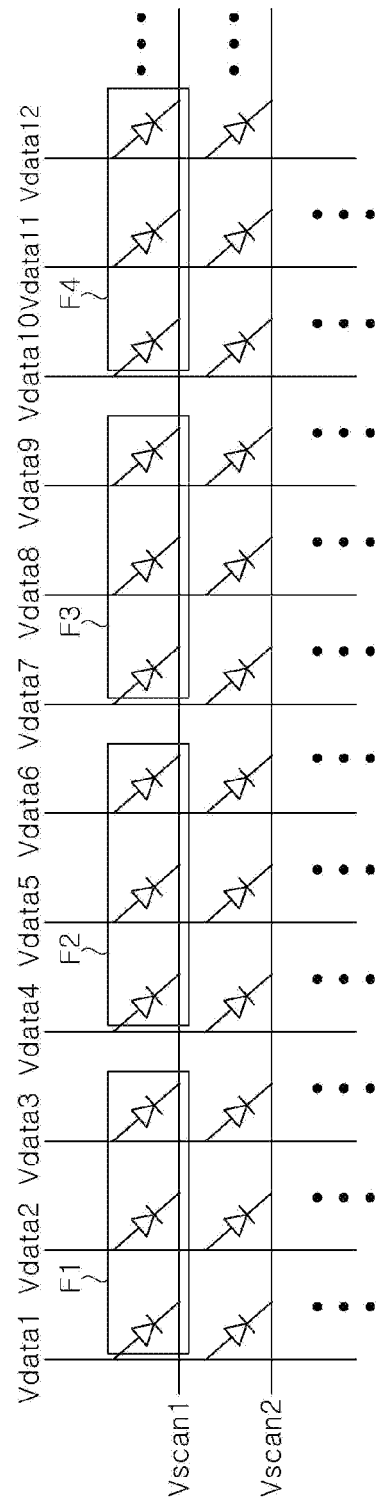
FIG. 9 is a schematic circuit diagram illustrating a driving manner of a display apparatus according to another exemplary embodiment.

FIG. 9 is a schematic circuit diagram illustrating a driving manner of a display apparatus according to another exemplary embodiment.

In FIG. 8, the anodes of all light emitting cells of the pixels F1, F2, F3, and F4 are connected to the same data line, however, according to the illustrated exemplary embodiment, anodes of all light emitting cells are connected to different data lines from one another within a drive circuit, and cathodes thereof are connected to the same scan line.

Figure 10:
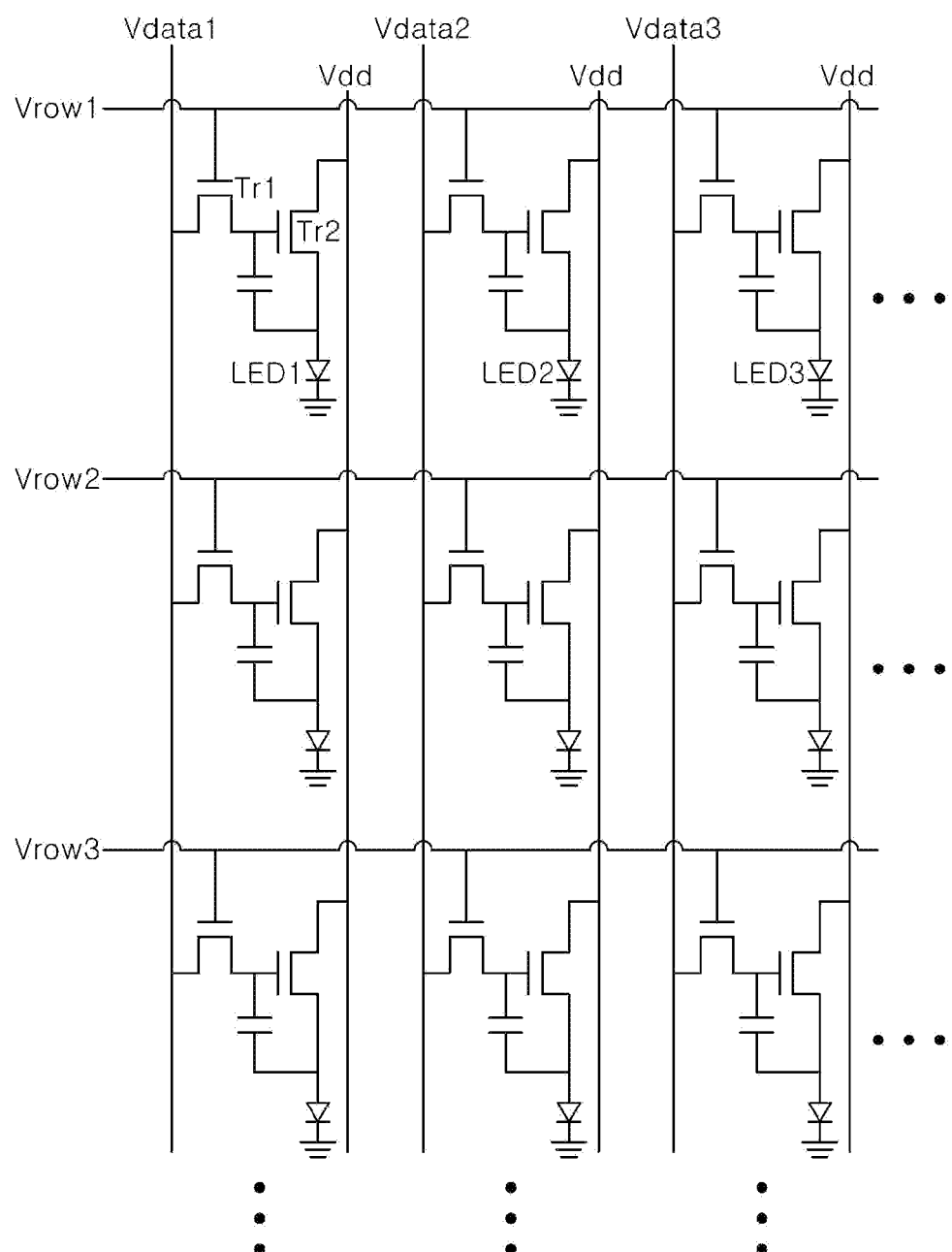
FIG. 10 is a schematic circuit diagram illustrating a driving manner of a display apparatus according to another exemplary embodiment.

FIG. 10 is a schematic circuit diagram illustrating a driving manner of a display apparatus according to another exemplary embodiment. The circuit diagrams illustrated in the previous exemplary embodiments of FIGS. 6 to 9 are for the passive matrix driving manner, while the circuit diagram according to the illustrated exemplary embodiment is for the active matrix driving manner.

Referring to FIG. 10, a driving circuit according to the illustrated exemplary embodiment includes two or more transistors Tr1 and Tr2 and a capacitor. When the power is connected to selection lines Vrow1, Vrow2, and Vrow3, and a data voltage is applied to data lines Vdata1, Vdata2, and Vdata3, voltages are applied to corresponding light emitting cells of LED1, LED2, or LED3. In addition, charges are charged in the corresponding capacitors according to values of Vdata1, Vdata2, and Vdata3. Since turn-on state of Tr2 may be maintained by the charging voltage of the capacitor, the voltage of the capacitor may be maintained and the voltage may be applied to the light emitting cells of LED1, LED2, and LED3 even when the Vrow1 is powered off. Further, the current flowing through LED1, LED2, and LED3 may be changed according to the values of Vdata1, Vdata2, and Vdata3. Current may always be supplied through common current supplies Vdd, and thus, continuous light emission is possible.

The transistors Tr1 and Tr2 and the capacitors may be formed in a circuit board 100. For example, a thin film transistor formed on a silicon substrate may be used for active matrix driving.

Anodes of the light emitting cells are connected to the transistor Tr2 and cathodes thereof are grounded.

Although FIG. 10 exemplarily shows a circuit diagram for driving light emitting cells the active matrix, in some exemplary embodiments, other circuits may be used. Further, although the anodes of the light emitting cells are described as being connected to different transistors Tr2 from one another and the cathodes thereof are described as being grounded, in some exemplary embodiments, the anodes of a plurality of light emitting cells may be connected to the same common current supply Vdd, and the cathodes thereof may be connected to different transistors from one another.

Various circuits for the passive matrix driving and active matrix driving have been described above. In the circuits, the anodes or cathodes of the light emitting cells may be commonly electrically connected. The first, second, and third light emitting cells 30a, 30b, and 30c of the LED unit 200 described above are electrically separated from one another in the LED unit 200, and are electrically connected to one another through the circuit board 100. However, some or all of the light emitting cells in the LED unit 200 may be electrically connected to one another in the LED unit, and electrical connection thereof will be described below.

Figure 11:
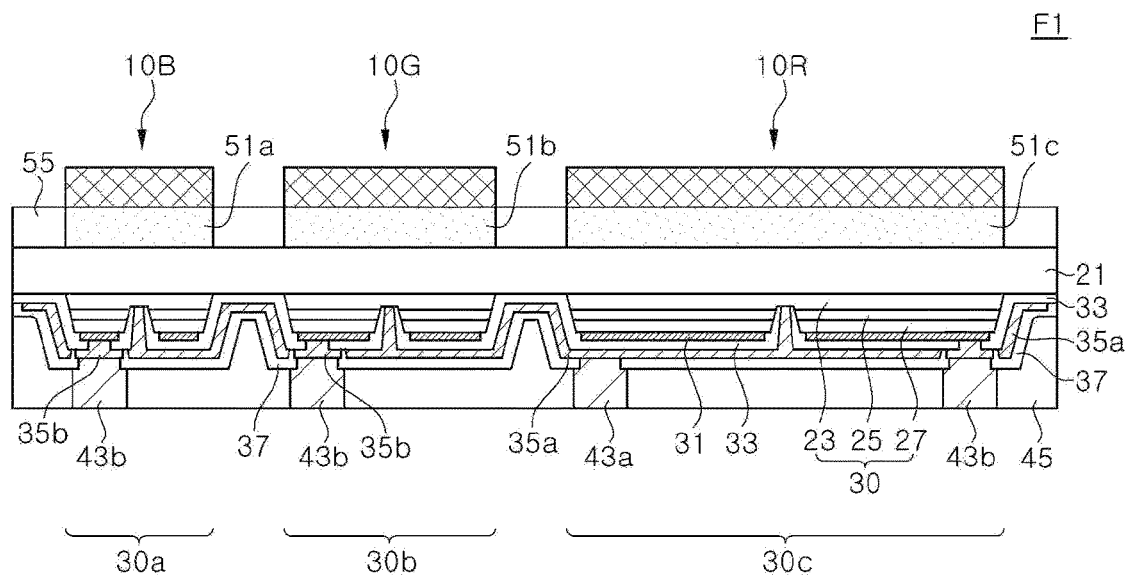
FIG. 11 is a schematic cross-sectional view of a pixel in an LED unit for a display according to another exemplary embodiment.

FIG. 11 is a schematic cross-sectional view of a pixel F1 in an LED unit for a display according to another exemplary embodiment.

Referring to FIG. 11, the pixel F1 according to the illustrated exemplary embodiment is substantially similar to that described with reference to FIG. 4, except that the first conductivity type semiconductor layers 23 of the light emitting cells 30a, 30b, and 30c are connected to one another by a first pad electrode 35a.

More particularly, a single first pad electrode 35a is formed over the light emitting cells 30a, 30b, and 30c, and is electrically connected to the first conductivity type semiconductor layers 23 in each region of the light emitting cells 30a, 30b, and 30c. Accordingly, cathodes of the light emitting cells 30a, 30b, and 30c are electrically connected to one another.

Since the first conductivity type semiconductor layers 23 of the light emitting cells 30a, 30b, and 30c are connected to one another by the first pad electrode 35a, it may not be necessary to form bump pads 43a on the respective light emitting cells, and current may be supplied to each of the light emitting cells 30a, 30b, and 30c using the single bump pad 43a.

Furthermore, the cathodes of the light emitting cells in at least two of the pixels F1, F2, F3, and F4 may be connected to one another by the first pad electrode 35a, and accordingly, the number of bump pads 43a required in the LED unit 200 may be further reduced.

Since the number of bump pads 43a may be reduced, the possibility of mounting failure while mounting the LED unit 200 on the circuit board 100 may be reduced.

Although light emitting cells 30a, 30b, and 30c in the illustrated exemplary embodiment are shown as being disposed under the substrate 21, in some exemplary embodiments, the substrate 21 may be omitted as described with reference to FIG. 5.

Figure 12:
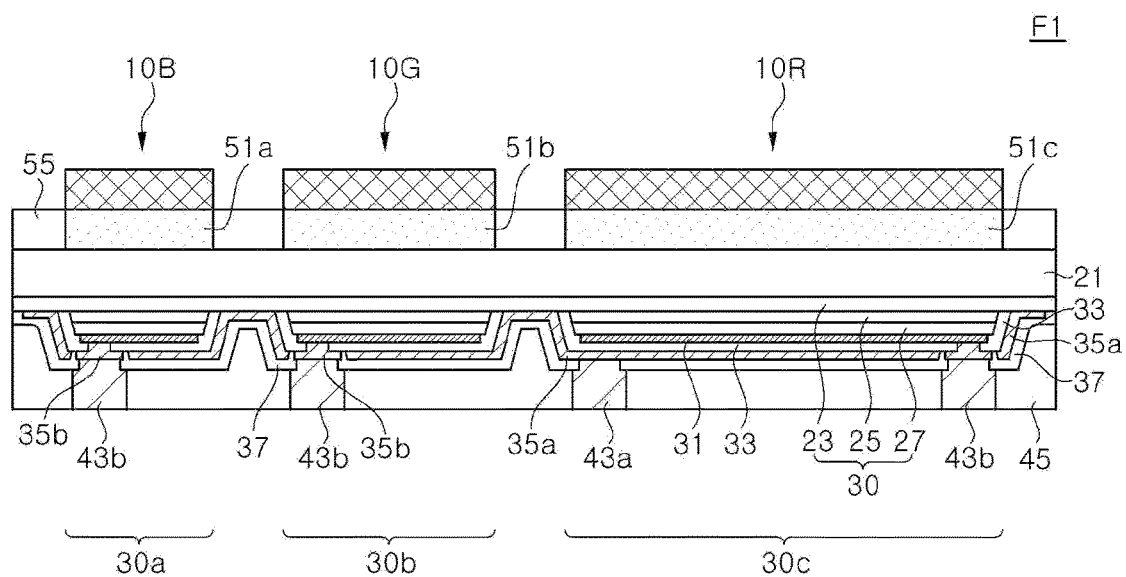
FIG. 12 is a schematic cross-sectional view of a pixel in an LED unit for a display according to another exemplary embodiment.

FIG. 12 is a schematic cross-sectional view of a pixel in an LED unit for a display according to another exemplary embodiment.

In FIG. 11, the first conductivity type semiconductor layers 23 of the light emitting cells 30a, 30b, and 30c are electrically connected using the first pad electrode 35a, however, light emitting cells 30a, 30b, and 30c in the illustrated exemplary embodiment share the first conductivity type semiconductor layer 23. More particularly, in FIG. 11, the first conductivity type semiconductor layers 23 are spaced apart from one another, and the first pad electrode 35a electrically connects the first conductivity type semiconductor layers 23 in the embodiment of FIG. 11. However, the light emitting cells 30a, 30b, and 30c according to the illustrated exemplary embodiment share the first conductivity type semiconductor layer 23. As such, the first pad electrode 35a may be connected to any portion of the first conductivity type semiconductor layer 23. For example, the first pad electrode 35a may be connected to the first conductivity type semiconductor layer 23 through a through hole as shown in FIG. 11, or the first pad electrode 35a may be connected to the first conductivity type semiconductor layer 23 in a region between the light emitting cells 30a, 30b, and 30c, or a region around the light emitting cells 30a, 30b, and 30c as shown in FIG. 12.

According to the illustrated exemplary embodiment, since the light emitting cells 30a, 30b, and 30c share the first conductivity type semiconductor layer 23, connection regions of the first pad electrode 35a may be selected variously, and thus, light emitting areas of the light emitting cells 30a, 30b, and 30c may be increased within a limited area of the LED unit 200.

Pixels F1, F2, F3, and F4 may also share the first conductivity type semiconductor layer 23, which will be described in detail later with reference to FIGS. 14 through 17.

Although light emitting cells 30a, 30b, and 30c of FIG. 12 are shown as being disposed under the substrate 21, in some exemplary embodiments, the substrate 21 may be omitted as described with reference to FIG. 5.

Figure 13:
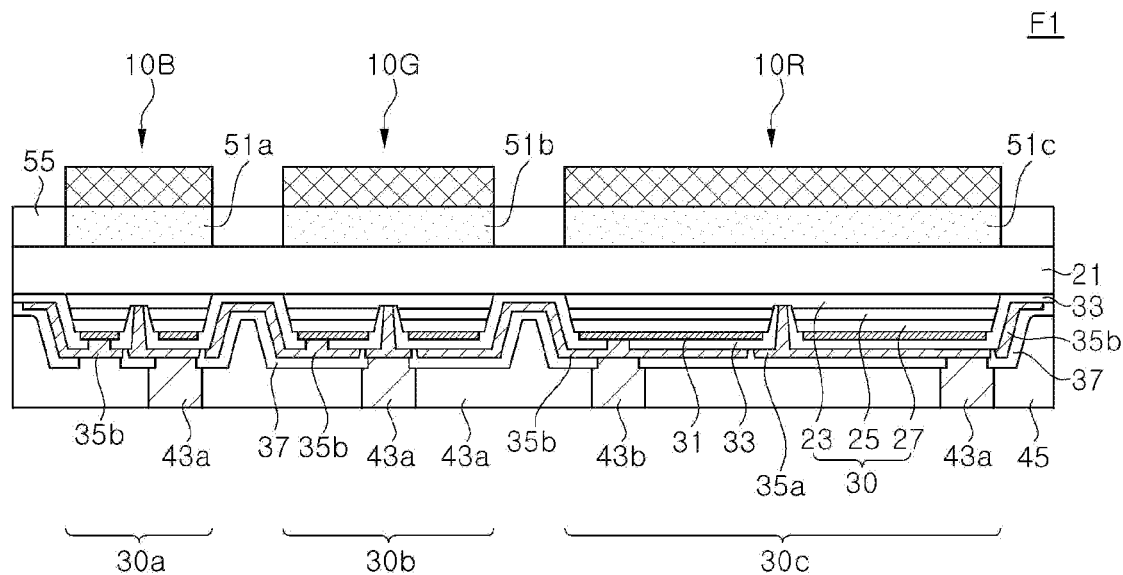
FIG. 13 is a schematic cross-sectional view of a pixel in an LED unit for a display according to another exemplary embodiment.

FIG. 13 is a schematic cross-sectional view of a pixel F1 in an LED unit for a display according to another exemplary embodiment.

Referring to FIG. 13, the foregoing exemplarily embodiments have described that the cathodes of the light emitting cells 30a, 30b, and 30c are electrically connected to one another, however, in the illustrated exemplary embodiment, anodes of the light emitting cells 30a, 30b, and 30c are electrically connected to one another.

More particularly, a second conductivity type semiconductor layers 27 of the light emitting cells 30a, 30b, and 30c are electrically connected to one another by a second pad electrode 35b. In contrast, first conductivity type semiconductor layers 23 of the light emitting cells 30a, 30b, and 30c are electrically separated from one another.

More particularly, the second pad electrode 35b may be continuously formed on the first, second, and third light emitting cells 30a, 30b, and 30c, and electrically connected to ohmic reflection layers 31 on each light emitting cell. The second pad electrode 35b according to the illustrated exemplary embodiment may also surround first pad electrodes 35a.

Since the second conductivity type semiconductor layers 27 of the light emitting cells 30a, 30b, and 30c are connected to one another by the second pad electrode 35b, bump pads 43b may not need to be disposed on each light emitting cell, and current may be supplied to each of the light emitting cells 30a, 30b, and 30c using a single bump pad 43b.

Anodes of the light emitting cells in at least two of the pixels F1, F2, F3, and F4 may be connected to one another by the second pad electrode 35b, and accordingly, the number of bump pads 43b required in the LED unit 200 may be further reduced.

Since the number of bump pads 43b may be reduced, the possibility of mounting failure while mounting the LED unit 200 on the circuit board 100 may be reduced.

Although the light emitting cells 30a, 30b, and 30c in the illustrated exemplary embodiment are shown as being disposed under the substrate 21, in some exemplary embodiments, the substrate 21 may be omitted as described with reference to FIG. 5.

Figure 14:
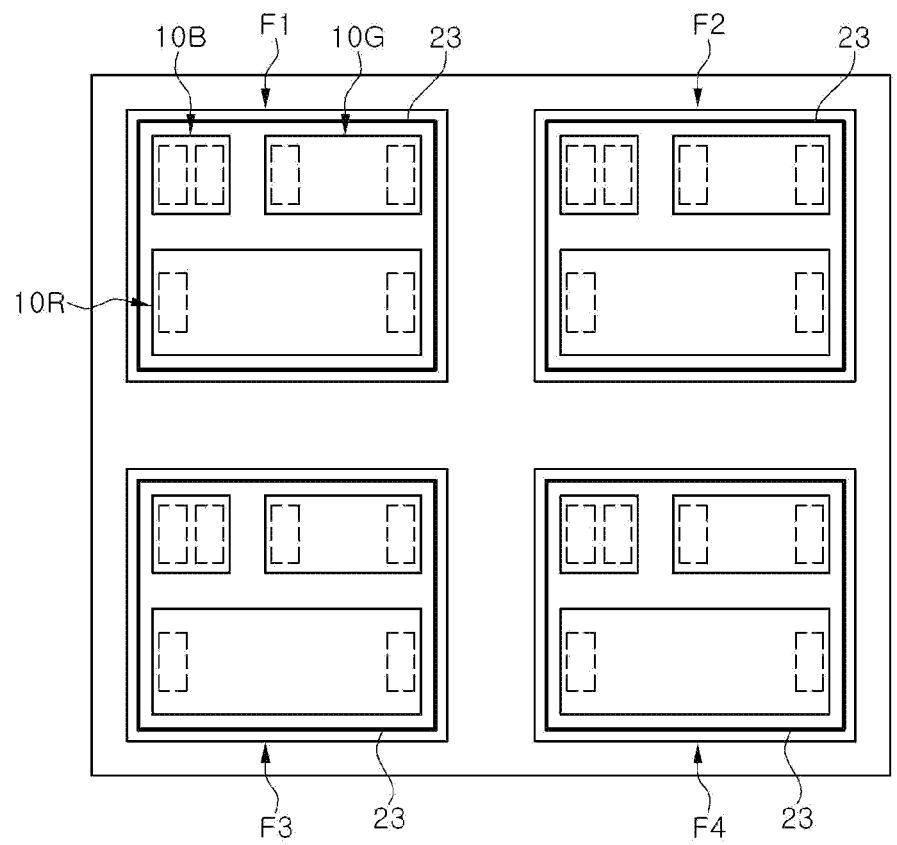
FIG. 14 is a schematic plan view illustrating an LED unit for a display according to another exemplary embodiment.

FIG. 14 is a schematic plan view illustrating an LED unit for a display according to another exemplary embodiment.

As described above with reference to FIG. 12, light emitting cells 30a, 30b, and 30c in each pixel F1, F2, F3, or F4 may share the first conductivity type semiconductor layer 23. However, as shown in the drawing, the first conductivity type semiconductor layers may be spaced apart from one another between the pixels.

According to the illustrated exemplary embodiment, since cathodes of the light emitting cells in one pixel are connected to one another, a circuit for connecting the light emitting cells may not need to be provided in a circuit board 100, and thus, the number of bump pads 43a may also be reduced. More particularly, one bump pad 43a and three bump pads 43b may be disposed for each pixel, and the one bump pad 43a may be formed at any one of the positions in which the bump pad 43a may be formed in each pixel (see FIG. 2).

For passive matrix driving, the cathodes of the light emitting cells in the same pixel will be connected to the same data line or scan line. For active matrix driving, the cathodes of the light emitting cells in the same pixel will be grounded.

Since the pixels F1, F2, F3, and F4 are electrically separated from one another, the pixels may be variously arranged in the driving circuit.

Figure 15:
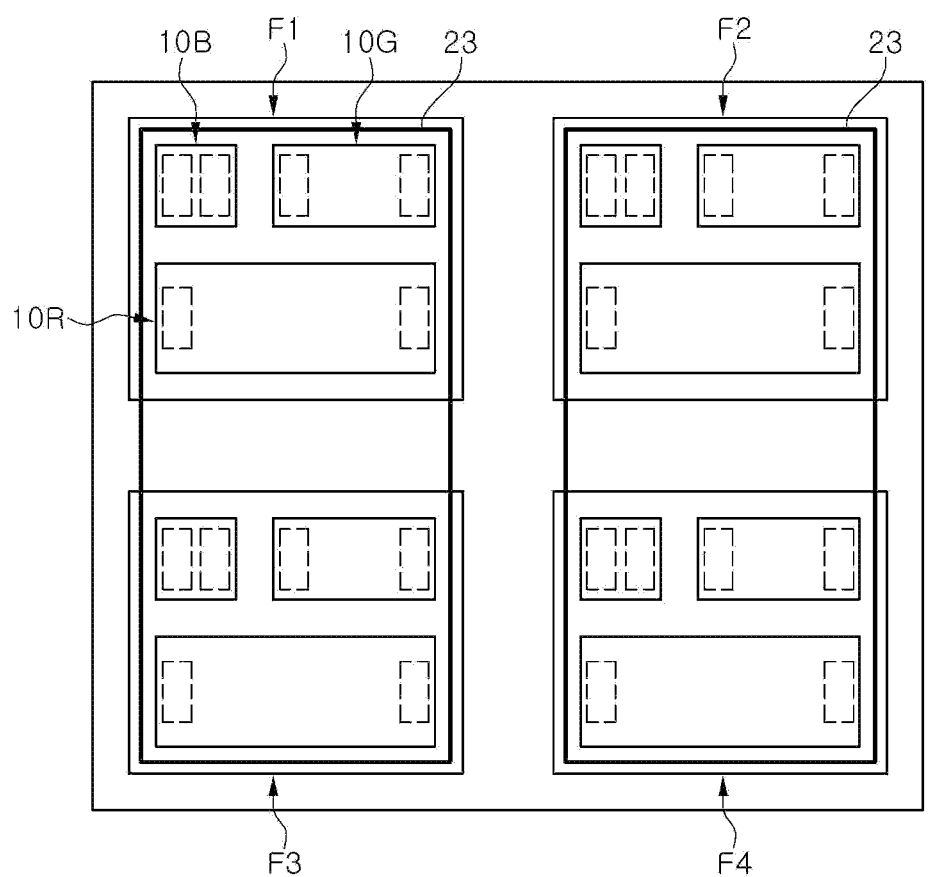
FIG. 15 is a schematic plan view illustrating an LED unit for a display according to an exemplary embodiment.

FIG. 15 is a schematic plan view illustrating an LED unit for a display according to another exemplary embodiment.

Referring to FIG. 15, in the illustrated exemplary embodiment, the pixel F1 and the pixel F3 share one first conductivity type semiconductor layer 23, and the pixel F2 and the pixel F4 share another first conductivity type semiconductor layer 23. Accordingly, a bump pad 43a that is common to the pixels F1 and F3 may be disposed, and a bump pad 43a that is common to the pixels F2 and F4 may be disposed, and thus, the number of the bump pads 43a may be further reduced than the configuration shown in FIG. 14. In this case, the bump pad 43a for the pixels F1 and F3 and the another bump pad 43a for the pixels F2 and F4 may each be formed at any one of the positions in which the bump pad 43a may be formed in shared pixels (see FIG. 2).

For passive matrix driving, cathodes of light emitting cells in the pixel F1 and the pixel F3 will all be connected to the same data line or scan line, and those of light emitting cells in the pixel F2 and the pixel F4 will be connected to the same data line or scan line. For active matrix driving, the cathodes of the light emitting cells in the pixels F1, F2, F3, and F4 will be grounded.

Figure 16:
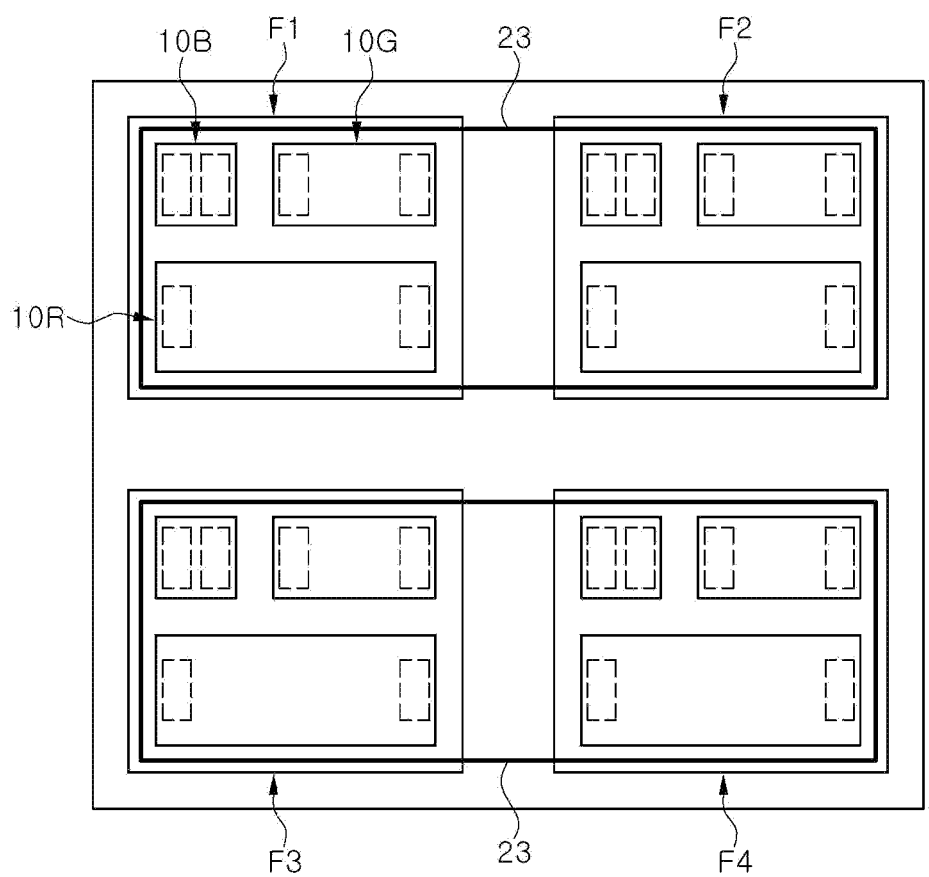
FIG. 16 is a schematic plan view illustrating an LED unit for a display according to an exemplary embodiment.

FIG. 16 is a schematic plan view illustrating an LED unit for a display according to another exemplary embodiment.

Referring to FIG. 16, pixels F1 and F2 share one first conductivity type semiconductor layer 23, and pixels F3 and F4 also share another first conductivity type semiconductor layer 23. Accordingly, a bump pad 43a that is common to the pixels F1 and F2 may be disposed, and a bump pad 43a that is common to the pixels F3 and F4 may be disposed, and thus, the number of the bump pads 43a may be further reduced than the configuration shown in FIG. 14. In this case, the bump pad 43a for the pixels F1 and F2 and the another bump pad 43a for the pixels F3 and F4 may each be formed at any one of the positions in which the bump pad 43a may be formed in shared pixels (see FIG. 2).

For passive matrix driving, cathodes of light emitting cells in the pixel F1 and the pixel F2 will all be connected to the same data line or scan line, and those of light emitting cells in the pixel F3 and the pixel F4 will be connected to the same data line or scan line. For active matrix driving, the cathodes of the light emitting cells in the pixels F1, F2, F3, and F4 will be grounded.

Figure 17:
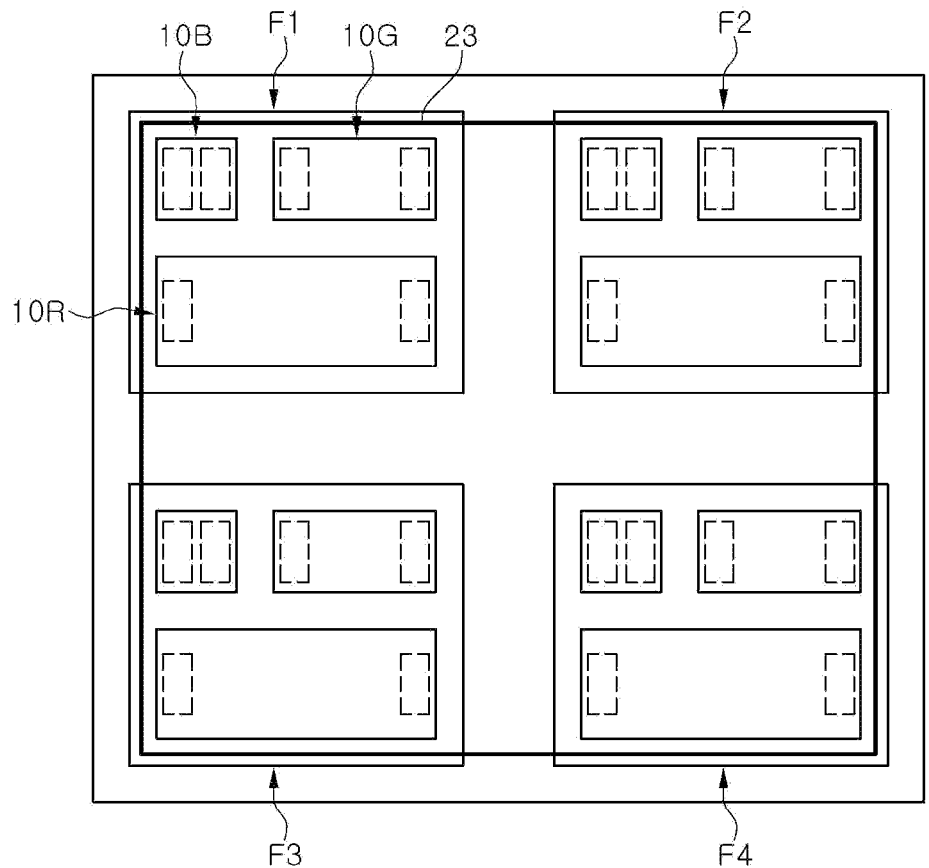
FIG. 17 is a schematic plan view illustrating an LED unit for a display according to an exemplary embodiment.

FIG. 17 is a schematic plan view illustrating an LED unit for a display according to another exemplary embodiment.

Referring to FIG. 17, each of the pixels F1, F2, F3, and F4 in the LED unit 200 may share a first conductivity type semiconductor layer 23. Accordingly, a bump pad 43a that is common to the pixels F1, F2, F3, and F4 may be disposed, further reducing the number of bump pads 43a than the configurations shown in FIG. 15 and FIG. 16. In this case, the bump pad 43a for the pixels F1, F2, F3, and F4 may be formed at any one of the positions in which the bump pad 43a may be formed in shared pixels (see FIG. 2).

Figure 18A:
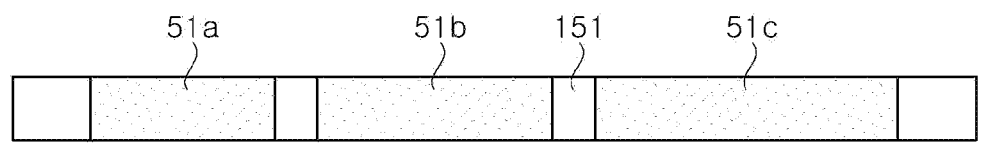
FIG. 18A and FIG. 18B are cross-sectional views illustrating a film including a wavelength converter.
Figure 18B:
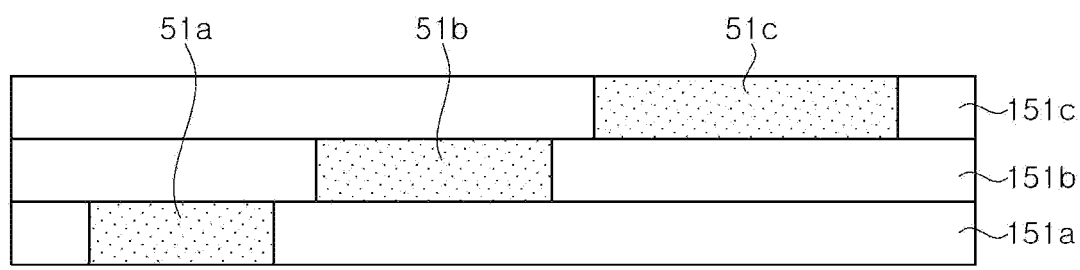

FIG. 18A and FIG. 18B are cross-sectional views illustrating a film including a wavelength converter according to exemplary embodiments.

Referring to FIG. 18A, the first, second, and third wavelength converters 51a, 51b, and 51c in the above exemplary embodiments may be spaced apart from one another to be individually attached or formed on light emitting cells 30a, 30b, and 30c, but first, second, and third wavelength converters 51a, 51b, and 51c in the illustrated exemplary embodiment are arranged in one layer in one film. A transparent or opaque resin 151 may be disposed in a region between the wavelength converters 51*a*, 51*b*, and 51*c*. The opaque resin 151 may function as a light blocking layer 55.

When the light emitting cells emit blue light, the first wavelength converter 51*a* may be omitted, and in this case, the transparent resin 151 may be disposed at a location where the first wavelength converter 51*a* is disposed.

A film including wavelength converters 51*a*, 51*b*, and 51*c* may be disposed on each pixel, or one film may cover two or more pixels.

Referring to FIG. 18B, the film according to the illustrated exemplary embodiment may be formed as a multi-layer laminated film. For example, a first layer 151*a* may include the first wavelength converter 51*a*, and a second layer 151*b* may include the second wavelength converter 51*b*, and a third layer 151*c* may include the third wavelength converter 51*c*. The first, second, and third layers 151*a*, 151*b*, and 151*c* may be formed as a combination of the transparent resin 151 and the wavelength converters 51*a*, 51*b*, and 51*c*, respectively. When the light emitting cells emit blue light, the first layer 151*a* may be omitted.

The laminated film may be disposed on each pixel, or a single laminated film may cover a plurality of pixels.

According to exemplary embodiments, a plurality of pixels that includes sub-pixels are disposed in one LED unit. The sub-pixels include a first, second, and third light emitting cells that emit light of different colors. As such, an LED unit for a display may be easily mounted and replacement of defective units may be facilitated. Furthermore, by varying areas of the first, second, and third light emitting cells, light emitting cells of each of the sub-pixels may be driven under an optimum light emission efficiency condition.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting diode (LED) unit for a display, comprising:
   a plurality of pixels each including:
      a first light emitting cell, a second light emitting cell, and a third light emitting cell, each of the first, second, and third light emitting cells including a first conductivity type semiconductor layer, an active layer, and a second conductivity type semiconductor layer;
      a first wavelength converter configured to convert a wavelength of light emitted from the first light emitting cell;
      a second wavelength converter configured to convert a wavelength of light emitted from the second light emitting cell; and
      pads electrically connected to the first, second, and third light emitting cells to independently drive the first, second, and third light emitting cells,
   wherein the first, second, and third light emitting cells of each pixel overlap at least one of the pads.

2. The LED unit of claim 1, wherein the first, second, and third light emitting cells are configured to be driven in a passive matrix or active matrix manner.

3. The LED unit of claim 1, wherein:
   the first, second, and third light emitting cells are configured to emit blue light;
   the first wavelength converter is configured to convert blue light into red light; and
   the second wavelength converter is configured to convert blue light into green light.

4. The LED unit of claim 1, further comprising a third wavelength converter configured to convert a wavelength of light emitted from the third light emitting cell to a shorter wavelength than that converted by the first or second wavelength converter,
   wherein the first, second, and third light emitting cells are configured to emit ultraviolet light.

5. The LED unit of claim 4, wherein:
   the first wavelength converter is configured to convert ultraviolet light into red light;
   the second wavelength converter is configured to convert ultraviolet light into green light; and
   the third wavelength converter is configured to convert ultraviolet light into blue light.

6. The LED unit of claim 1, further comprising a light blocking layer disposed between the wavelength converters.

7. The LED unit of claim 1, further comprising ohmic reflection layers disposed on the second conductivity type semiconductor layers of the first, second, and third light emitting cells, respectively.

8. The LED unit of claim 1, further comprising a lower insulation layer disposed between the light emitting cells to prevent light interference between the light emitting cells.

9. The LED unit of claim 8, wherein the lower insulation layer comprises a distributed Bragg reflector.

10. The LED unit of claim 1, wherein the pads include:
    the first, second, and third light emitting cells of each pixel share the first conductivity type semiconductor layer;
    at least one common pad commonly electrically connected to the shared first conductivity type semiconductor layer; and
    individual pads electrically connected to the second conductivity type semiconductor layers of the first, second, and third light emitting cells, respectively.

11. The LED unit of claim 10, further comprising a support member covering side surfaces of the pads, the support member including a thermosetting or thermoplastic resin.

12. The LED unit of claim 1, wherein at least two pixels share the same first conductivity type semiconductor layer.

13. The LED unit of claim 1, wherein the pixels are arranged in a matrix form in the LED unit.

14. The LED unit of claim 1, wherein four pixels are arranged in the LED unit.

15. A light-emitting diode (LED) unit for a display, comprising:
    a plurality of pixels each including:
       a first light emitting cell, a second light emitting cell, and a third light emitting cell, each of the first, second, and third light emitting cells including a first conductivity type semiconductor layer, an active layer, and a second conductivity type semiconductor layer; and
       a multi-layer laminated film including:
          a first layer including a first wavelength converter configured to convert a wavelength of light emitted from the first light emitting cell; and
          a second layer disposed on top of the first layer and including a second wavelength converter configured to convert a wavelength of light emitted from the second light emitting cell.

16. The LED unit of claim 15, wherein the multi-layer laminated film further includes a third layer disposed on top of the second layer and including a third wavelength converter configured to convert a wavelength of light emitted from the third light emitting cell.

17. The LED unit of claim 16, wherein the first, second, and third wavelength converters do not overlap each other.

18. The LED unit of claim 16, wherein each of the first, second, and third layers comprises a transparent resin.

19. The LED unit of claim 16, wherein the first, second, and third light emitting cells are configured to emit ultraviolet light.

20. The LED unit of claim 15, further comprising pads electrically connected to the first, second, and third light emitting cells to independently drive the first, second, and third light emitting cells,
  wherein the first, second, and third light emitting cells of each pixel overlap at least one of the pads.

* * * * *